United States Patent
Ecarnot et al.

(10) Patent No.: US 9,768,057 B2
(45) Date of Patent: Sep. 19, 2017

(54) METHOD FOR TRANSFERRING A LAYER FROM A SINGLE-CRYSTAL SUBSTRATE

(71) Applicant: Soitec, Crolles Cedex (FR)

(72) Inventors: Ludovic Ecarnot, Vaulnaveys-le-Haut (FR); Nicolas Daval, Lumbin (FR); Nadia Ben Mohamed, Echirolles (FR); Francois Boedt, Meylan (FR); Carole David, Crolles (FR); Isabelle Guerin, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/159,646

(22) Filed: May 19, 2016

(65) Prior Publication Data
US 2016/0351438 A1    Dec. 1, 2016

(30) Foreign Application Priority Data

May 28, 2015   (FR) .................................. 15 54818

(51) Int. Cl.
| | | |
|---|---|---|
| *H01L 21/66* | (2006.01) | |
| *H01L 21/762* | (2006.01) | |
| *H01L 21/02* | (2006.01) | |
| *B28D 5/00* | (2006.01) | |

(52) U.S. Cl.
CPC ......... *H01L 21/76251* (2013.01); *B28D 5/00* (2013.01); *H01L 21/02002* (2013.01); *H01L 21/76254* (2013.01)

(58) Field of Classification Search
CPC ............. H01L 27/088; H01L 21/76254; H01L 21/02002; H01L 21/76251

USPC .......................................................... 438/14
See application file for complete search history.

(56) References Cited

U.S. PATENT DOCUMENTS

| | | |
|---|---|---|
| 5,374,564 A | 12/1994 | Bruel |
| 2003/0087503 A1 | 5/2003 | Sakaguchi et al. |
| 2004/0061200 A1 | 4/2004 | Iwamatsu et al. |
| 2004/0242001 A1* | 12/2004 | Toba ....................... C30B 29/42 438/690 |

(Continued)

FOREIGN PATENT DOCUMENTS

FR   2894067 A1   6/2007

OTHER PUBLICATIONS

European Search Report and Opinion, for European Application No. 16171740, dated Sep. 30, 2016, 5 pages.

(Continued)

*Primary Examiner* — Vongsavanh Sengdara
(74) *Attorney, Agent, or Firm* — TraskBritt (57) ABSTRACT

A method for transferring a layer from a single-crystal substrate, called a donor substrate, onto a receiver substrate, includes supplying the single-crystal donor substrate, the substrate having a notch oriented in a first direction of the crystal and a weakness region bounding the layer to be transferred, bonding of the single-crystal donor substrate onto the receiver substrate, the main surface of the donor substrate opposite to the weakness region with respect to the layer to be transferred being at the bonding interface, and detachment of the donor substrate along the weakness region. In the method, the donor substrate has, on the main surface bonded to the receiver substrate, an array of atomic steps extending essentially in a second direction of the crystal different from the first direction.

7 Claims, 4 Drawing Sheets

(56) References Cited

U.S. PATENT DOCUMENTS

| | | | |
|---|---|---|---|
| 2009/0304994 A1 | 12/2009 | Daub et al. | |
| 2010/0176493 A1* | 7/2010 | Ben Mohamed | H01L 21/76254 |
| | | | 257/620 |
| 2013/0267046 A1* | 10/2013 | Or-Bach .............. | H01L 27/088 |
| | | | 438/14 |
| 2014/0339681 A1 | 11/2014 | Figuet et al. | |

OTHER PUBLICATIONS

French Written Opinion for French Application No. 1554818, dated May 28, 2015, 5 pages.
French Preliminary Report for French Application No. 1554818, dated Mar. 15, 2016, 2 pages.

* cited by examiner

METHOD FOR TRANSFERRING A LAYER FROM A SINGLE-CRYSTAL SUBSTRATE

CROSS-REFERENCE TO RELATED APPLICATION

Pursuant to 35 U.S.C. §119(a), this application claims the benefit of the filing date of French Patent Application No. 1554818, filed May 28, 2015, the disclosure of which is hereby incorporated herein in its entirety by this reference.

TECHNICAL FIELD

The present disclosure relates to a method for transferring a layer from a single-crystal substrate, called a donor substrate, onto another substrate, called a receiver substrate, and a structure obtained by such a method.

BACKGROUND

Single-crystal substrates, notably made of semiconductor materials such as silicon, are commonly used in the field of microelectronics. Such substrates are typically obtained starting from ingots. More precisely, the fabrication of these substrates comprises:
  the growth of an ingot starting from a seed of the crystal, for example, by the Czochralski method, the orientation of the seed determining the crystal orientation of the ingot,
  the slicing of the ingot into a plurality of sections, the slicing being carried out along planes substantially perpendicular to the axis of the ingot,
  the formation of a notch on the circumference of each section, the notch extending in the axial direction of the section,
  the slicing of each section into a plurality of wafers, the slicing being carried out along planes substantially perpendicular to the axis of the section,
  the implementation of a treatment for finishing the wafers, which may notably comprise polishing, cleaning, and/or the formation of peripheral chamfers, in order to form a respective substrate.

An application of such a single-crystal substrate is the transfer of a layer from this substrate, then called a "donor substrate," onto another substrate called a "receiver substrate." A known technique for such a transfer is the SMART CUT® method, in which, by implantation into the donor substrate, a weakness region is created that bounds a layer to be transferred, the donor substrate is bonded onto the receiver substrate and the substrate is detached along the weakness region, in such a manner as to transfer the layer onto the receiver substrate.

Following this transfer, the free surface of the transferred layer, which is opposite the surface of the donor substrate that has been bonded to the receiver substrate, exhibits a high roughness, which requires finishing processing steps.

Indeed, this roughness has a strong influence on the performance characteristics of the electronic devices formed in or on the transferred layer. For example, a high roughness leads to a significant variability in the threshold voltages of the transistors fabricated in or on this layer.

In order to repair the surface, known solutions are to apply various finishing processes, notably a thermal annealing, aimed at smoothing the surface.

However, the roughness of the transferred layer is not optimal and needs to be reduced in order to improve the performance characteristics of the devices intended to be fabricated in or on the transferred layer.

BRIEF SUMMARY

One aim of the present disclosure is to design a layer transfer method that allows the roughness of the free surface of the transferred layer to be significantly reduced.

The present disclosure, therefore, provides a method for transferring a layer from a single-crystal substrate, called a donor substrate, onto a receiver substrate, comprising:
  the supply of the single-crystal donor substrate, the substrate having a notch oriented in a first direction of the crystal and a weakness region bounding the layer to be transferred,
  the bonding of the single-crystal donor substrate onto the receiver substrate, the main surface of the donor substrate opposite the weakness region with respect to the layer to be transferred being at the bonding interface, and
  the detachment of the donor substrate along the weakness region.

According to the present disclosure, on the main surface bonded onto the receiver substrate, the donor substrate has an array of atomic steps essentially extending in a second direction of the crystal different from the first direction.

The phrase "atomic steps essentially extending in a single direction of the crystal," in other words, the atomic steps are substantially one-dimensional, should be understood to mean that the length of the steps in the direction is large with respect to the length of the steps in an orthogonal direction, in other words, the ratio between the lengths is greater than or equal to 2. For example, in the case of a silicon substrate, it is considered that steps having a length greater than 0.6 μm in one direction and a length less than 0.3 μm in the other are substantially one-dimensional.

By virtue of this method, when the donor substrate has a notch extending in a direction such that an inclination of the slicing of a single-crystal section in the direction would generate two-dimensional steps at the surface of the substrate, better results are obtained in terms of repair of the free surface of the transferred layer originating from the donor substrate having substantially one-dimensional steps when the steps at the surface of the donor substrate are two-dimensional.

Advantageously, the density of atoms in the second direction is greater than in the first direction.

The steps typically have at least twice the length in the second direction of the crystal than in another direction perpendicular to the second direction.

According to one embodiment, the thickness of the transferred layer is greater than or equal to 150 nm.

Preferably, the donor substrate has a crystal lattice with a centered cubic, face-centered cubic or diamond structure.

According to one embodiment, the donor substrate is obtained by slicing a section of single-crystal ingot, the slice being made with an inclination only in the second direction of the crystal.

For example, a main surface of the section is in a plane with a normal direction <100>, the notch is oriented with an angle of 45° with respect to a direction <110> and the slice is made with an inclination only in the direction <110>, in such a manner that the atomic steps extend essentially in the direction <110>.

According to one preferred embodiment, the donor substrate is made of silicon.

Another subject relates to a structure comprising a single-crystal layer on a substrate, the single-crystal layer having a notch oriented in a first direction of the crystal, characterized in that the main surface of the single-crystal layer opposite to the substrate has an array of atomic steps essentially extending in a second direction of the crystal different from the first direction.

The steps typically have at least twice the length in the second direction of the crystal as in another direction perpendicular to the second direction.

According to one embodiment, the single-crystal layer has a crystal lattice of centered cubic, face-centered cubic or diamond structure.

According to one particular embodiment, the single-crystal layer is made of silicon.

For example, the notch is oriented with an angle of 45° with respect to a direction <110> of the crystal and the atomic steps extend essentially in the direction <110>.

According to one embodiment, the thickness of the single-crystal layer is greater than or equal to 150 nm.

BRIEF DESCRIPTION OF THE DRAWINGS

Other features and advantages of the present disclosure will become apparent from the detailed description that follows, with reference to the appended drawings in which.

DETAILED DESCRIPTION

Embodiments of the present disclosure take advantage of a link established by the inventors between the morphology of the crystal lattice at the surface of the single-crystal substrate (one-dimensional or two-dimensional steps) and the quality of repair of the free surface of the transferred single-crystal layer. As explained hereinbelow, the same morphology is found on the free surface of the transferred layer as on the surface of the single-crystal substrate. However, the inventors have discovered that the reconstruction of the single-crystal material during thermal treatment processes applied after the transfer of the layer from the donor substrate onto the receiver substrate exhibited a different quality depending on the morphology of the free surface of the transferred layer. These thermal treatment processes are notably smoothing anneal processes involving temperatures of around 1100° C. to 1250° C.

The position of the notch with respect to the crystal lattice of the ingot is imposed by the end user of the substrates comprising the transferred layer, in other words, generally the manufacturer of electronic components that will be formed in or on the transferred layer.

Depending on the case, the notch may be oriented in a given direction of the crystal (for example, in the case of silicon (100), in the direction <110>), or else in a direction oriented by 45° with respect to the given direction.

The notch can have an isosceles triangular cross-section, and the orientation of the notch is defined by the median of the triangle. The orientation of the notch may be dictated by requirements on charge carrier mobility (where the mobility may be different depending on the direction in question) and/or by constraints associated with a process implemented later on (for example, an etch step may give different results depending on the crystal orientation of the substrate in which it is carried out).

In other cases, which are also within the scope of the present disclosure, the notch consists of a flat formed on the circular periphery of the donor substrate.

In practice, the slicing of the sections is not carried out according to a plane strictly corresponding to a crystallographic plane of the substrate, but with a slight inclination in one or two orthogonal directions of the crystallographic plane. This slicing methodology is aimed at controlling the morphology of the surface of the substrate.

Figure 1A:
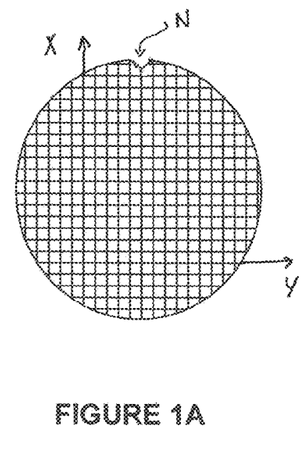
FIGS. 1A and 1B are top views of a section of single-crystal silicon (100) having a notch oriented in a direction <110> of the crystal and a notch oriented at 45° with respect to the direction <110>, respectively.
Figure 1B:
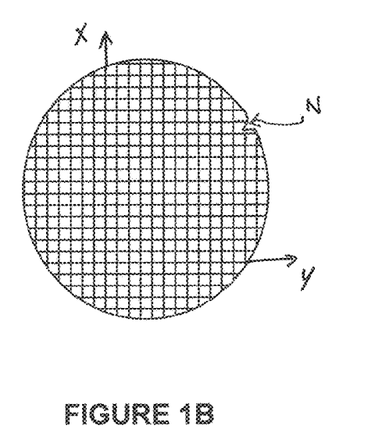

FIGS. 1A and 1B are top views of a plane with a normal direction <100> of a section of a single-crystal material from group IV of the periodic table of the elements (for example, silicon or germanium), which exhibits a diamond structure.

In the case of FIG. 1A, the section has a notch N oriented in a crystallographic direction <110>, in other words, a direction in which the covalent bonds of the crystal are oriented.

In the case of FIG. 1B, the section has a notch oriented at 45° (in other words, in a direction <100>) with respect to the crystallographic directions <110>, which are represented by the orthogonal axes X and Y.

The notch is not shown to scale for reasons of readability of the figures.

During the fabrication of the substrates, the inclination of the slice with respect to the normal to the crystal plane is specified for each of the axes X and Y.

Figure 2A:
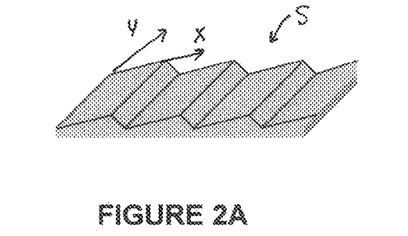
FIG. 2A is a perspective view of one-dimensional steps at the surface of a silicon substrate.
Figure 2B:
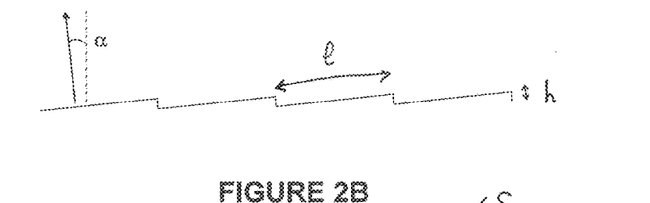
FIG. 2B is a cross-sectional view of the steps.

When the inclination only exists in the axis X (the inclination, therefore, being zero in the Y axis), the surface S of the substrate exhibits a succession of steps—whose height h generally corresponds to the lattice parameters of the material of the substrate—that run parallel to the axis Y in the direction X, as illustrated in FIGS. 2A (in perspective) and 2B (in cross-section). These are then referred to as one-dimensional (denoted by the abbreviation 1D) steps; the greater the angle of inclination a, the shorter the length of the steps in the direction X.

Figure 3:
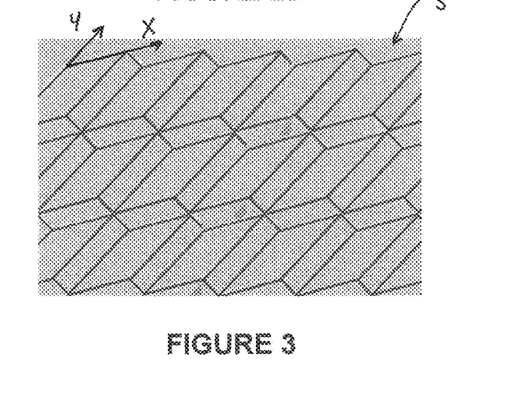
FIG. 3 is a perspective view of two-dimensional steps at the surface of a silicon substrate.

When there exists an inclination in the two axes X and Y, the surface S of the substrate exhibits an array of two-dimensional (2D) steps, which run parallel to the two axes X and Y, as illustrated in FIG. 3. As indicated hereinabove, the greater the angle of inclination along one axis, the shorter the length of the steps in that direction.

When the substrate is intended to receive an epitaxial layer, a surface exhibiting 1D steps is desirable. See, e.g., U.S. Patent Application Publication No. 2009/0304994, now U.S. Pat. No. 8,133,318. This is because, at the intersection between perpendicular edges of the 2D steps, the steps exhibit singular points that can generate defects in the epitaxial layer.

As a consequence, the slicing is generally carried out with an inclination along a single axis, the inclination along the other axis being substantially zero.

However, it turns out that the slicing of the sections is indexed to the notch; in other words, the manufacturer of substrates does not consider as axes X, Y the crystallographic directions but the axis of the notch and an axis orthogonal to the notch.

When the notch is oriented along a crystallographic direction for which the slicing generates 1D steps (in the case of FIG. 1A), the inclination of the slice takes place in that direction. An array of 1D steps is, therefore, obtained such as shown schematically in FIG. 2A.

In contrast, when the notch is oriented at 45° with respect to a crystallographic direction for which the slicing generates 1D steps (in the case of FIG. 1B), the surface of the substrate obtained after slicing exhibits an array of 2D steps such as shown schematically in FIG. 3.

The inventors have observed that it was, surprisingly, easier to repair the surface of the transferred layer when the donor substrate had been sliced with an inclination in a direction of the crystal generating 1D steps than when it had been sliced with an inclination in a single direction corresponding to the orientation of the notch (then generating 2D steps).

This phenomenon seems to be explained by the fact that the free surface of the single-crystal layer, after its transfer onto the receiver substrate, exhibits an array of steps similar to that of the surface of the donor substrate, which corresponds to the surface opposite to the free surface. In other words, the free surface of the transferred layer has the same inclination as the opposite surface coming from the slicing of a single-crystal section, the whole of the single crystal being disoriented owing to the inclination of the slicing.

Furthermore, the morphology of the free surface of the single-crystal layer affects the quality of the repair of the surface obtained by a smoothing anneal. Indeed, the roughness resulting from a smoothing anneal is substantially higher when the surface exhibits an array of 2D steps than when it exhibits an array of 1D steps.

Such an influence of the morphology on the quality of the repair was unexpected given that the high-frequency roughness of the free surface of the transferred layer after fracture is very large irrespective of the morphology of the main surface of the donor substrate (the latter being equivalent to a low-frequency roughness).

The transfer implements the following steps.

Figure 4A:
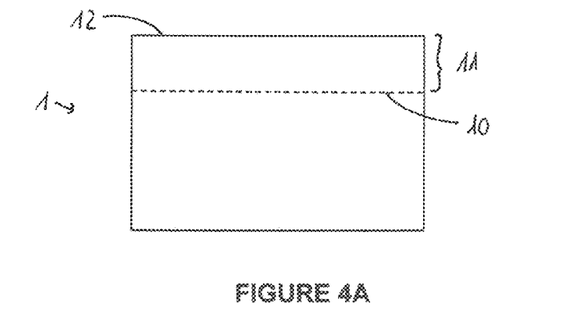
FIGS. 4A to 4C illustrate successive steps of the method for transferring a layer from the single-crystal donor substrate onto a receiver substrate.

With reference to FIG. 4A, a donor substrate 1 is supplied having a weakness region 10 bounding layer 11 to be transferred. The donor substrate 1 is a single crystal and has a notch (not shown) oriented in a direction in which an inclination of the slice would generate 2D steps, typically oriented at 45° with respect to a direction of the crystal in which an inclination of the slice would generate 1D steps. The donor substrate 1 is not necessarily a bulk substrate: it may comprise a multilayer of various single-crystal (or otherwise) substrates, at least one of which includes the single-crystal layer to be transferred, the latter substrate having the notch.

For example, in the case of a substrate of a single-crystal material from group IV of the periodic table of the elements (for example, silicon or germanium), which have a diamond structure, with a normal direction <100>, the notch is oriented at 45° with respect to a direction <110>; in other words, it is oriented in a direction <100>, and the slicing is carried out in the direction <110>.

On its main surface 12 opposite to the weakness region 10 with respect to the layer 11 to be transferred, the donor substrate 1 exhibits an array of substantially one-dimensional atomic steps, in other words, extending essentially in a single direction of the crystal.

For this purpose, the donor substrate 1 is obtained by slicing a section of single-crystal ingot, carried out with an inclination in a single direction of the crystal chosen so as to generate 1D steps. This measure is, therefore, in contrast to the usual practice of inclining the slice with respect to the notch, which generates 2D steps.

The weakness region 10 is advantageously formed by implantation of atomic species at a given depth of the donor substrate 1, in order to implement the SMART CUT® method. On this subject, reference may be made to U.S. Pat. No. 5,374,564, the contents of which are hereby incorporated herein in their entirety by this reference. However, other techniques for weakness of the donor substrate may be implemented, notably the ELTRAN™ method such as described in the document U.S. Patent Publication 2003/0087503, the contents of which are also hereby incorporated herein in their entirety by this reference.

Figure 4B:
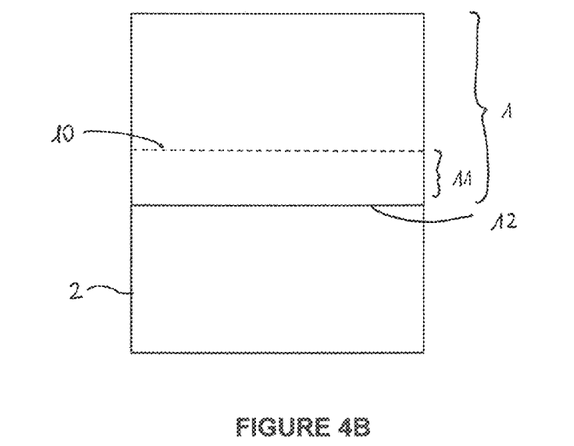

With reference to FIG. 4B, the donor substrate 1 is bonded onto a receiver substrate 2, the main surface 12 of the donor substrate 1 opposite to the weakness region 10 with respect to the layer 11 to be transferred and having the substantially one-dimensional steps being at the bonding interface. The donor substrate 1 and/or the receiver substrate 2 could potentially be coated, on the side of the bonding interface, with a layer of dielectric.

After the donor and receiver substrates 1, 2, respectively, have been brought into contact, this can be followed by a thermal treatment for reinforcing the adhesion.

Figure 4C:
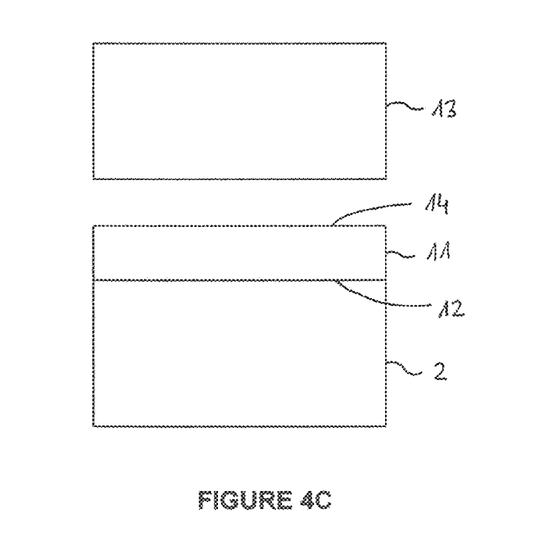

With reference to FIG. 4C, the donor substrate 1 is detached along the weakness region 10. After this step, the layer 11 remains bonded onto the receiver substrate 2, the remaining part 13 of the donor substrate 1 being separated and potentially re-used. The detachment may be carried out by fracturing the donor substrate 1 at the level of the weakness region 10, where the fracture may be generated, for example, mechanically or thermally.

The free surface 14 of the layer 11 transferred onto the receiver substrate 2 exhibits one-dimensional atomic steps, similar to the atomic steps observed on the main surface 12 of the donor substrate 1.

The thickness of the transferred layer is typically greater than or equal to 150 nm.

Subsequently, a thermal annealing is implemented aimed at smoothing the free surface of the transferred layer (step not illustrated). This annealing is implemented at a temperature in the range between 1100° C. and 1250° C. over a period of a few minutes.

Where appropriate, other steps for finishing the free surface of the transferred layer may be implemented, such as a polishing step, a cleaning step, etc.

As can be seen in FIGS. 5A, 5B and 6A, 6B, the smoothing anneal is much more effective on a free surface exhibiting the array of one-dimensional steps obtained with embodiments of the present disclosure than in the case where the free surface exhibits an array of two-dimensional steps.

Figure 5A:
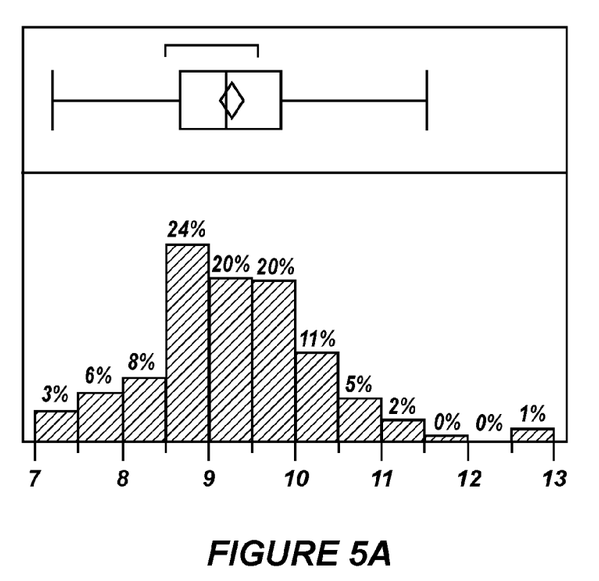
FIGS. 5A and 5B show the peak-valley amplitude of the free surface of the transferred layer after the application of a smoothing anneal, for a donor substrate exhibiting 2D steps and 1D steps, respectively.
Figure 5B:
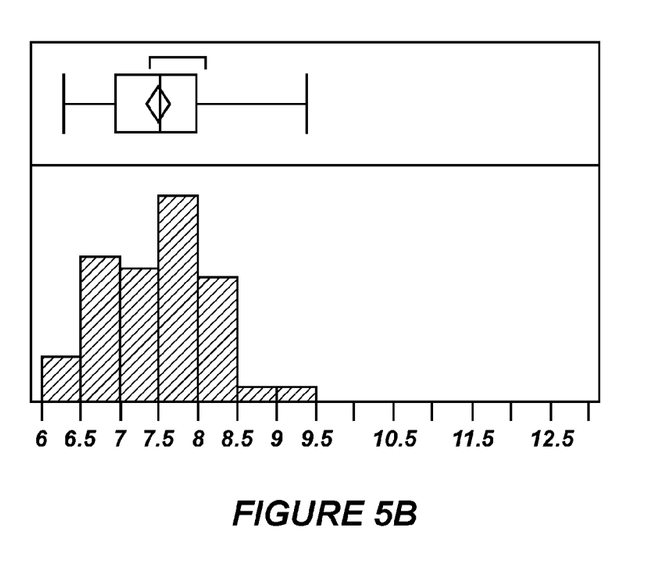

FIGS. 5A and 5B show the peak-valley amplitude of the roughness of the free surface of the transferred layer after the application of a smoothing anneal such as described hereinabove, for a donor silicon substrate with a normal direction <100> exhibiting 2D steps (the section of ingot having been sliced in the direction of the notch oriented at 45° with respect to a direction generating 1D steps) and 1D steps (the section of ingot having been sliced, according to the present disclosure, in a single direction of the crystal generating 1D steps, hence at 45° with respect to the orientation of the notch), respectively. The measurement of roughness is performed by the DRM (acronym for Differential Reflectometry Microscopy) technique with a field of 88×66 µm$^2$.

This mean peak-valley is 9.27 Å in the case of the 2D steps and 7.49 Å in the case of the 1D steps, meaning a reduction of 20% as a result of the present disclosure.

Figure 6A:
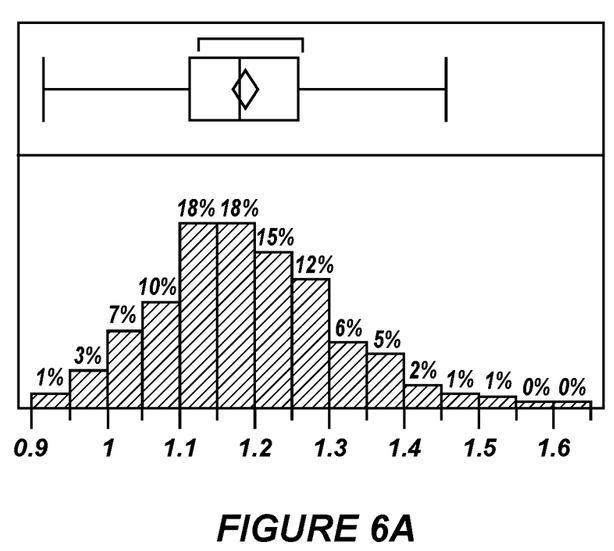
FIGS. 6A and 6B show the standard deviation of the roughness of the free surface of the transferred layer after the application of a smoothing anneal, for a donor substrate exhibiting 2D steps and 1D steps, respectively.
Figure 6B:
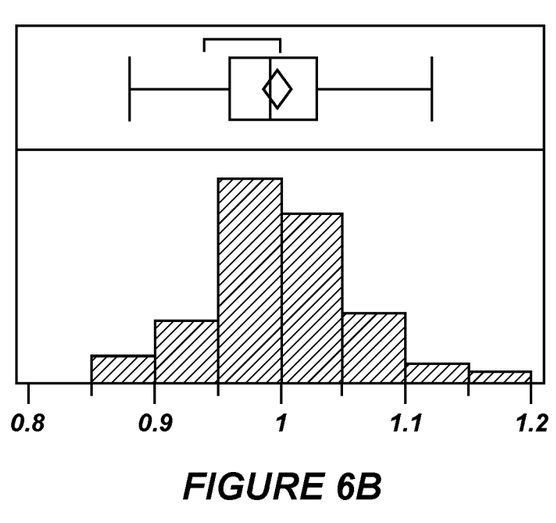

FIGS. 6A and 6B show the standard deviation of the roughness of the free surface of the transferred layer after the application of a smoothing anneal, for a donor substrate exhibiting 2D steps and 1D steps, respectively.

The mean standard deviation is 1.19 Å in the case of the 2D steps and 0.99 Å in the case of the 1D steps, or a reduction of around 17% as a result of the present disclosure.

What is claimed is:

1. A method for transferring a layer from a single-crystal substrate, called a donor substrate, onto a receiver substrate, comprising:
   supplying the single-crystal donor substrate, the donor substrate having a notch oriented in a first direction of the crystal of the donor substrate and a weakness region bounding the layer to be transferred,
   bonding the single-crystal donor substrate onto the receiver substrate, a main surface of the donor substrate opposite to the weakness region with respect to the layer to be transferred being at the bonding interface,
   detaching the donor substrate along the weakness region, thus transferring the layer to be transferred onto the receiver substrate, the transferred layer defining a free surface opposite the main surface bonded to the receiver substrate,
   wherein the donor substrate is obtained by slicing a section of single crystal ingot, the slicing being made with an inclination only in a second direction of the crystal of the ingot different from the first direction, and the donor substrate has, on the main surface bonded to the receiver substrate and on the free surface opposite the main surface, an array of atomic steps extending essentially in the second direction of the crystal of the donor substrate different from the first direction.

2. The method of claim 1, wherein a density of atoms in the second direction is greater than a density of atoms in the first direction.

3. The method of claim 1, wherein the steps of the array of steps have at least twice a length in the second direction of the crystal than in another direction perpendicular to the second direction.

4. The method of claim 1, wherein a thickness of the transferred layer is greater than or equal to 150 nm.

5. The method of claim 1, wherein the donor substrate has a crystal lattice with a centered cubic, face-centered cubic or diamond structure.

6. The method of claim 1, wherein a main surface of the section of the single crystal ingot is in a plane with a normal direction <100>, the notch is oriented with an angle of 45° with respect to a direction <110> and the slicing is made with an inclination only in the direction <110>, in such a manner that the atomic steps extend essentially in the direction <110>.

7. The method of claim 1, wherein the donor substrate is made of silicon.

* * * * *

UNITED STATES PATENT AND TRADEMARK OFFICE
CERTIFICATE OF CORRECTION

PATENT NO. : 9,768,057 B2  
APPLICATION NO. : 15/159646  
DATED : September 19, 2017  
INVENTOR(S) : Ludovic Ecarnot et al.

Page 1 of 1

It is certified that error appears in the above-identified patent and that said Letters Patent is hereby corrected as shown below:

In the Specification  
Column 4, Line 53, change "of inclination a," to --of inclination α,--  
Column 4, Line 53, change "the length of the" to --the length $\ell$ of the--

Signed and Sealed this  
Twenty-second Day of May, 2018

Andrei Iancu  
*Director of the United States Patent and Trademark Office*